(12) United States Patent
Ucciardello et al.

(10) Patent No.: US 8,604,868 B2
(45) Date of Patent: Dec. 10, 2013

(54) DYNAMIC BIASING CIRCUIT FOR A PROTECTION STAGE USING LOW VOLTAGE TRANSISTORS

(75) Inventors: Carmelo Ucciardello, Catania (IT); Antonino Conte, Tremestieri (IT); Giovanni Matranga, Catania (IT); Rosario Roberto Grasso, Acicastello (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/435,210

(22) Filed: Mar. 30, 2012

(65) Prior Publication Data
US 2012/0274393 A1 Nov. 1, 2012

(30) Foreign Application Priority Data
Apr. 1, 2011 (IT) .............................. TO2011A0294

(51) Int. Cl.
*G05F 1/10* (2006.01)

(52) U.S. Cl.
USPC .......................................... 327/536; 327/333

(58) Field of Classification Search
USPC ................................................. 327/536, 333
See application file for complete search history.

(56) References Cited

U.S. PATENT DOCUMENTS

| | | | |
|---|---|---|---|
| 5,867,042 A | 2/1999 | Briner | |
| 5,969,542 A * | 10/1999 | Maley et al. | 326/81 |
| 7,046,067 B2 * | 5/2006 | Chung | 327/333 |
| 7,199,617 B1 * | 4/2007 | Schrom et al. | 326/86 |
| 7,602,233 B2 * | 10/2009 | Pietri et al. | 327/536 |
| 7,969,235 B2 * | 6/2011 | Pan | 327/537 |
| 8,049,553 B2 * | 11/2011 | Kim et al. | 327/536 |
| 2008/0024177 A1 | 1/2008 | Mao | |
| 2008/0238523 A1 | 10/2008 | Thorp et al. | |
| 2009/0039942 A1 | 2/2009 | Cook et al. | |
| 2009/0051413 A1 * | 2/2009 | Chu et al. | 327/536 |
| 2009/0219077 A1 * | 9/2009 | Pietri et al. | 327/536 |
| 2010/0019831 A1 * | 1/2010 | Han | 327/536 |
| 2010/0327959 A1 * | 12/2010 | Lee | 327/536 |
| 2011/0063012 A1 * | 3/2011 | Chan et al. | 327/333 |
| 2012/0019303 A1 * | 1/2012 | Singh | 327/333 |
| 2012/0218032 A1 * | 8/2012 | Nadimpalli | 327/536 |

* cited by examiner

*Primary Examiner* — Thomas J Hiltunen
(74) *Attorney, Agent, or Firm* — Allen, Dyer, Doppelt, Milbrath & Gilchrist, P.A.

(57) ABSTRACT

A biasing circuit may include an input configured to receive a supply voltage, a value of which is higher than a limit voltage. The biasing circuit may also include a control stage configured to generate first and second control signals with mutually complementary values, equal alternatively to a first value, in a first half-period of a clock signal, or to a second value, in a second half-period of the clock signal. The first and second values may be a function of the supply and limit voltages. The biasing circuit may also include a biasing stage configured to generate a biasing voltage as a function of the values of the first and second control signals. The first and second control signals may control transfer transistors for transferring the supply voltage to respective outputs, while the biasing voltage may be for controlling protection transistors to reduce overvoltages on the transfer transistors.

18 Claims, 4 Drawing Sheets

DYNAMIC BIASING CIRCUIT FOR A PROTECTION STAGE USING LOW VOLTAGE TRANSISTORS

FIELD OF THE INVENTION

The present invention relates to a dynamic biasing circuit for a protection stage of an electronic integrated circuit using low voltage transistors.

BACKGROUND OF THE INVENTION

As is known, there is a wide range of applications in which, in an electronic integrated circuit, the need may arise to use voltages of a value higher than the ones commonly used in the same circuit. For example, this need may arise from specific requirements of energy saving, area occupation, increase in speed, or the like.

The use of high voltage values may, however, entail risks of damage or even breakdown of the circuit elements, in particular transistors, used in the integrated circuit, which are generally designed for sustaining voltage values not higher than a certain threshold (typically lower than the high voltage values required).

From this risk of damage or breakdown, it may be desirable to use appropriate protection stages, which are designed in such a way as to protect the most critical circuit elements from overvoltages generated by the presence in the electronic integrated circuit of the aforesaid high voltage values. For example, in the case of metal oxide semiconductor (MOS) transistors, these protection stages are designed to reduce or prevent voltages on the oxides of the transistors, i.e., the voltages across the conduction terminals and/or control terminals of the transistors, from exceeding a maximum sustainable threshold. In the case of low voltage transistors, this threshold generally coincides with a logic supply voltage Vdd used in the electronic integrated circuit.

By way of example, the case may be applicable to storage devices, for example, of a flash type provided with 90-nm CMOS technology, present in an internal supply voltage (the so-called "logic supply voltage Vdd", with values, for example, between 1 V and 1.35 V). Moreover, to modify (for programming or erasure) and read the contents of the memory cells it may be desirable to use higher operating voltages, with values, for example, between 1.65 V and 10 V, which are generated by appropriate charge-pump circuits.

As is moreover known, in level-shifter circuits, which have a wide range of applications in electronics, for example, to interface two integrated circuits operating at different voltage levels, it may be desirable to protect parts of the circuit from overvoltages.

Figure 1A:
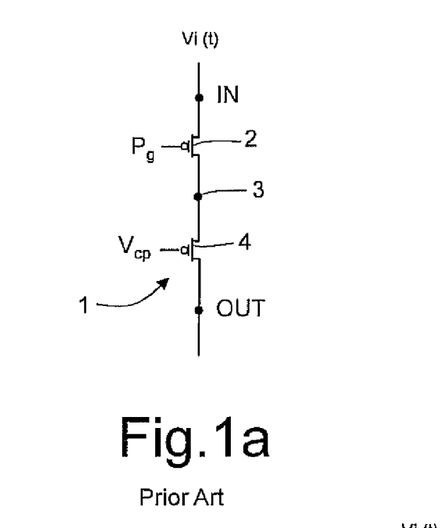
FIG. 1a is a schematic diagram of a protection arrangement for a p-channel MOS type transfer transistor in accordance with the prior art.

FIG. 1a is a schematic illustration of an exemplary use of a protection stage 1 for protecting a transfer transistor 2 from overvoltages, which is controlled to selectively transfer, from an input terminal In (acting as first transfer terminal) to an output terminal Out (acting as second transfer terminal) a high voltage Vi(t), higher than a maximum voltage sustainable by the transfer transistor itself (which is, for example, of the low voltage type).

In detail, the transfer transistor 2, for example, of a PMOS type, is coupled between the input terminal In, present on which is the high voltage Vi(t), and an internal node 3. The transfer transistor 2 has its control terminal (or gate terminal) receiving a control signal $P_g$. The high voltage Vi(t) has a value higher than a maximum voltage sustainable by the transfer transistor 2 itself (for example, higher than a logic supply voltage Vdd), and, moreover, has a possible variability with time or with the operating conditions.

The protection stage 1 in this case comprises a protection transistor 4, of a low voltage PMOS type, which is connected between the internal node 3 and an output terminal Out, and receives, on a corresponding control terminal (or gate terminal) of its own, an appropriate biasing voltage $V_{cp}$. The protection transistor 4 is connected in the so-called "cascode" configuration to the transfer transistor 2 (being, that is, cascaded and traversed by the same current that traverses the transfer transistor 2).

In use, the transfer transistor 2 is controlled via the control signal $P_g$ in such a way as to enable (via its closing) selective transfer of the high voltage Vi(t) from the input In to the output Out. The protection transistor 4 has the function of not hindering this transfer (being brought into a state of closing or conduction, when the transfer transistor 2 is closed) and moreover of protecting the same transfer transistor 2 from overvoltages due to the presence of the high voltage Vi(t) so as to reduce breakdown or damage thereto.

Figure 1B:
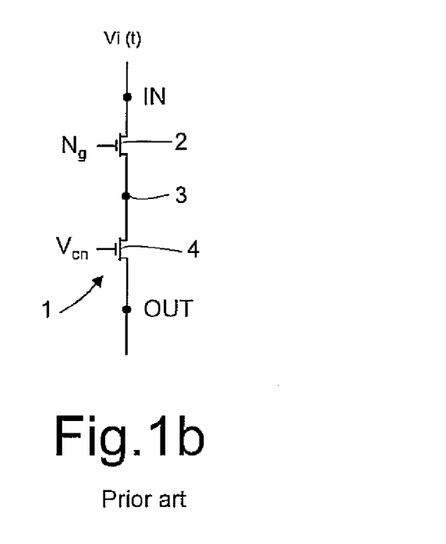
FIG. 1b is a schematic diagram of a protection arrangement for an n-channel MOS types transfer transistor in accordance with the prior art.

FIG. 1b is a schematic illustration of a similar circuit structure, using n-channel MOS transistors, and, in particular, a transfer transistor 2, which receives a control signal $N_g$, and a protection transistor 4, which receives a biasing voltage $V_{cn}$, of an appropriate value, to perform the function of protection of the transfer transistor 2 (and so as not to hinder transfer of the high voltage Vi(t) from the input In to the output Out).

Generally, the protection stage is biased voltage-divider circuits, but the use of voltage dividers may not be easy to implement in the case where the high voltage Vi(t) is variable. This is, for example, the case of charge-pump circuits, in which the high voltage Vi(t) that has to be transferred from the input to the output varies from one stage of the circuit to another. The same difficulty moreover arises in the case where the high voltage Vi(t) is variable with time or with the circuit operating conditions, for example, based upon a variation of the electrical performance of a corresponding supply source. Basically, biasing circuits of a known type cannot be optimized for dynamic biasing conditions, i.e., being variable and able to adapt in time and/or as the operating conditions vary.

SUMMARY OF THE INVENTION

The aim of the present invention is consequently to address, at least in part, the problems highlighted above, and to provide a circuit for dynamic biasing of a protection stage of an electronic integrated circuit. According to the present invention, a biasing circuit may include an input configured to receive a supply voltage, a value of which is higher than a limit voltage, and an output. The biasing circuit may also include a control stage configured to generate a first control signal and a second control signal, with mutually complementary values, equal alternately to a first value in a first half-period of a clock signal, and to a second value in a second half-period of the clock signal. The first and second values may be a function of the supply voltage and of the limit voltage. The biasing circuit may also include a biasing stage configured to generate on the output a biasing voltage as a function of the values of the first control signal and of the second control signal.

The first value may be equal to the supply voltage, and the control stage may be configured to adjust the second value by a value equal to the limit voltage with respect to the supply voltage. The biasing stage may be configured to generate the biasing voltage equal to at least one of a minimum and a maximum of the values of the first and second control signals, and to have a substantially constant value throughout the period of the clock signal.

The control stage may include a first biasing capacitor having a first terminal coupled to a first internal node, and a second terminal configured to receive a first low voltage phase signal having alternatively at least one of a reference value and a value equal to the limit voltage. The control stage may further include a second biasing capacitor having a first terminal coupled to a second internal node, and a second terminal configured to receive a second low voltage phase signal, complementary with respect to the first low voltage phase signal. The control stage may further include a first control transistor coupled between the input and the first internal node, and having a control terminal coupled to the second internal node. A second control transistor may be coupled between the input and the second internal node, and having a control terminal coupled to the first internal node. The first control transistor and the second control transistor may be configured to sustain voltages between at least one of corresponding current-conduction terminals and control terminals not higher than the limit voltage.

The biasing stage may include a first buffer capacitor coupled connected to a third internal node and configured to receive the second low voltage phase signal, and a second buffer capacitor coupled to a fourth internal node and configured to receive the first low voltage phase signal. The biasing stage may further include a first biasing transistor coupled between the third internal node and the output, and having a respective control terminal coupled to the fourth internal node. The biasing stage may further include a second biasing transistor coupled between the fourth internal node and the output, and having a respective control terminal coupled to the third internal node. A third biasing transistor may have a first conduction terminal configured to receive the first control signal, and a second conduction terminal coupled to the output, and having a respective control terminal coupled to the third internal node. The biasing stage may further include a fourth biasing transistor having a first conduction terminal configured to receive the second control signal, and a second conduction terminal coupled to the output, and having a respective control terminal coupled to the fourth internal node.

The first, second, third, and fourth biasing transistors may be configured to sustain voltages across at least one of the corresponding current-conduction terminals and control terminals not higher than the limit voltage. The value of the supply voltage may be less than or equal to twice the value of the limit voltage.

DETAILED DESCRIPTION OF THE PREFERRED EMBODIMENTS

Figure 2:
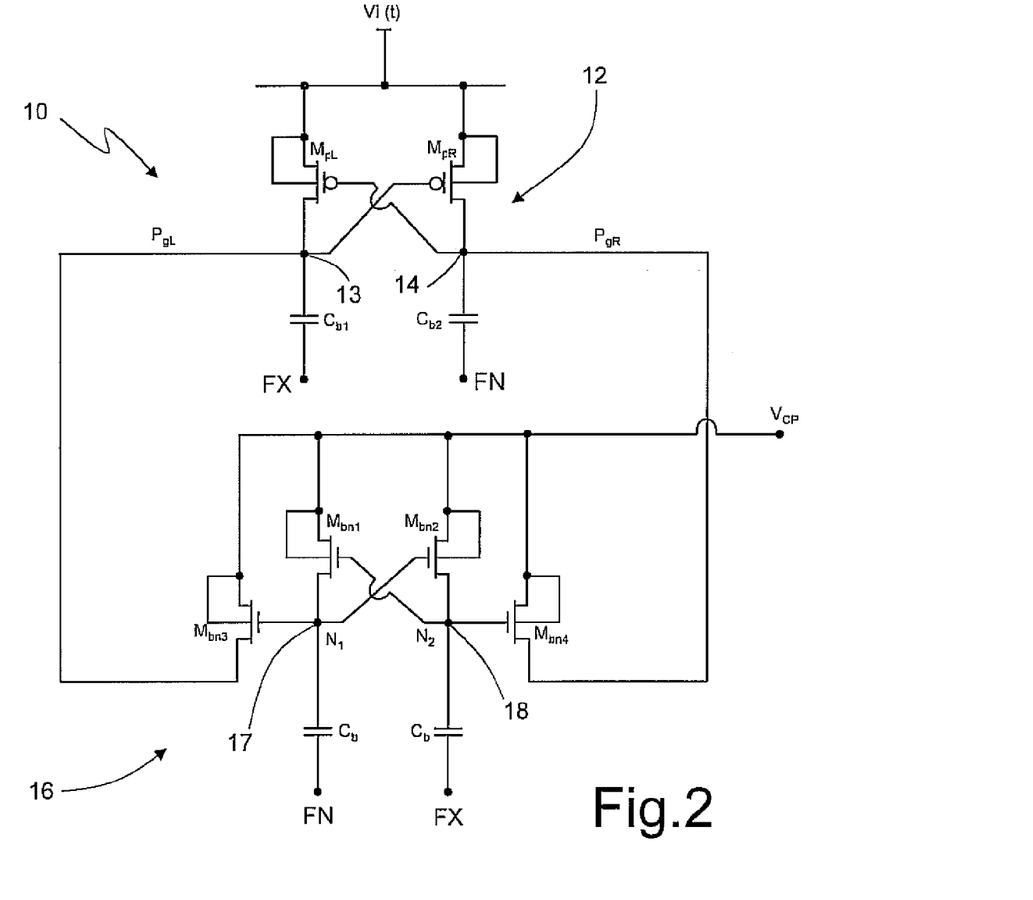
FIG. 2 is a schematic diagram of a biasing circuit according to a first embodiment of the present invention.

For a better understanding of the present invention, preferred embodiments thereof are now described, purely by way of non-limiting example, with reference to the attached drawings. FIG. 2 shows a dynamic biasing circuit according to a first embodiment of the present invention, designated as a whole by 10, in particular for biasing p-channel (transfer and/or protection) MOS transistors.

The biasing circuit 10 comprises a control stage 12 configured to generate appropriate control signals $P_{gL}$, $P_{gR}$ for the gate terminals of respective transfer transistors (here not illustrated), which can be alternately driven for transferring a high voltage Vi(t) to a respective output, in respective half-periods of a timing or clock signal (as will be better illustrated hereinafter, with reference to possible applications of the biasing circuit 10).

The control stage 12 receives, at an input, the high voltage Vi(t) and low voltage phase signals FX, FN (operating in the low voltage range, or logic voltage range, comprised between 0 V, or ground, and Vdd, for example, with values in the range between 1 V and 1.35 V), and supplies, at an output, the aforesaid control signals $P_{gL}$, $P_{gR}$. The first and second low voltage phase signals FX, FN are generated starting from the logic supply voltage Vdd and have complementary values (or values negated with respect to one another). In other words, when the first low voltage phase signal FX is at a high value equal to Vdd, the second low voltage phase signal FN is at a low value equal to Gnd (ground), and, vice versa. When the first low voltage phase signal FX is equal to Gnd, the second low voltage phase signal FN is, instead, equal to Vdd. The phase signals FX, FN have a periodic waveform (for example, of the square type), switching at a given frequency, given by the clock signal.

In greater detail, the control stage 12 comprises a first biasing capacitor $C_{b1}$, which has a first terminal receiving the first low voltage phase signal FX and a second terminal connected to a first internal node 13, on which it supplies a first control signal $P_{gL}$. The control stage 12 also includes a second biasing capacitor $C_{b2}$, which has a first terminal receiving the second low voltage phase signal FN and a second terminal connected to a second internal node 14, on which it supplies a second control signal $P_{gR}$. The control stage 12 also includes a first control transistor $M_{pL}$, of a low voltage PMOS type, which is connected between a reference terminal set at the high voltage Vi(t) and the first internal node 13, and has its gate terminal connected to the second internal node 14. A second control transistor $M_{pR}$, of a low voltage PMOS type, is connected between the reference terminal set at the high voltage Vi(t) and the second internal node 14, and has its gate terminal connected to the first internal node 13 (note that the first and second control transistors $M_{pL}$, $M_{pR}$ are hence connected in latch configuration).

During operation of the control stage 12, when the first low voltage phase signal FX is high (Vdd) and the second low voltage phase signal FN is low (Gnd), the first control transistor $M_{pL}$ is on, whereas the second control transistor $M_{pR}$ is off. The first control signal $P_{gL}$ goes to the value of the high voltage Vi(t), whereas the second control signal $P_{gR}$, which was at the value of the high voltage Vi(t) in the previous half-period of the clock signal, drops by a value equal to the logic supply voltage Vdd, assuming the value (Vi(t)−Vdd).

The control stage 12 behaves in a similar way in the next half-period of the clock signal, when the first low voltage phase signal FX switches to the low value (Gnd) and the second low voltage phase signal FN switches to the high value (Vdd). It follows that the control signals $P_{gL}$ and $P_{gR}$ are each time complementary to one another, and their range of values goes from (Vi(t)−Vdd), low value, to Vi(t), high value.

The control transistors $M_{pL}$, $M_{pR}$ moreover enable the capacitances of the biasing capacitors $C_{b1}$, $C_{b2}$ to be updated to the voltage of the nodes to which they are connected and to recover the charge lost for driving the respective transfer transistors (as will be illustrated hereinafter, via the control signals $P_{gL}$ and $P_{gR}$). The biasing capacitors hence act as "bootstrap" capacitors.

The biasing circuit 10 further comprises a biasing stage 16, configured to generate an appropriate biasing voltage $V_{cp}$ of a substantially constant value throughout the period of the clock signal (for example, not being subjected to a variation higher than 4-6%), in this case equal to the minimum voltage that can be assumed by the first and second control signals $P_{gL}$, $P_{gR}$, which, on basis of the foregoing discussion, is in particular equal to (Vi(t)−Vdd). This biasing voltage $V_{cp}$ is to be sent to the control terminal of appropriate protection elements (in particular p-channel MOS transistors), connected in cascade configuration to respective transfer transistors. Intuitively, this choice of the value of the biasing voltage $V_{cp}$ enables effective switching-on/switching-off of the protection transistors, i.e., issuing of a command to said transistors for complete switching-on/complete switching-off.

In detail, the biasing stage 16 includes a first buffer capacitor $C_b$, which receives on a first terminal the second low voltage phase signal FN and has the second terminal connected to a third internal node 17, present on which is a first gate signal $N_1$. The biasing stage 16 also includes a second buffer capacitor $C_b$ which receives on a first terminal the first low voltage phase signal FX and has the second terminal connected to a fourth internal node 18, present on which is a second gate signal $N_2$.

The biasing stage 16 further includes a first biasing transistor $M_{bn1}$, of a low voltage NMOS type, which has a first conduction terminal connected to the output of the biasing stage 16 and set at the biasing voltage $V_{cp}$ and a second conduction terminal, which is connected to the third internal node 17, and has its control terminal (or gate terminal) connected to the fourth internal node 18. The biasing stage 16 also includes a second biasing transistor $M_{bn2}$, of a low voltage NMOS type, which has a first conduction terminal set at the biasing voltage $V_{cp}$ and a second conduction terminal connected to the fourth internal node 18, and has its control terminal (or gate terminal) connected to the third internal node 17 (note that the first and second biasing transistors $M_{bn1}$, $M_{bn2}$ are hence connected in latch configuration). A third biasing transistor $M_{bn3}$, of a low voltage NMOS type, which has a first conduction terminal supplying the biasing voltage $V_{cp}$, and a second conduction terminal receiving the first control signal $P_{gL}$, has its control terminal (or gate terminal) connected to the third internal node 17. A fourth biasing transistor $M_{bn4}$, of a low voltage NMOS type, which has a first conduction terminal supplying the biasing voltage $V_{cp}$, and a second conduction terminal receiving the second control signal $P_{gR}$, has its control terminal (or gate terminal) connected to the fourth internal node 18.

Operation of the biasing stage 16 is such that the biasing voltage $V_{cp}$ is constant throughout the operating period of the biasing circuit 10, and in particular equal to the minimum voltage of the control signals $P_{gL}$ and $P_{gR}$. In detail, in a first half-period of the clock signal, the following conditions arise (note that "ON" and "OFF" indicate, respectively, the conditions of switching-on and switching-off of the associated transistors):

$$FX=0\,V\;;\;FN=Vdd$$

$$M_{pL}\rightarrow OFF;\;M_{pR}\rightarrow ON$$

$$P_{gL}=(Vi(t)-Vdd)\;;\;P_{gR}=Vi(t)$$

In the same half-period of the clock signal, the following further conditions arise:

$$M_{bn1}\rightarrow OFF;\;M_{bn2}\rightarrow ON$$

$$N_1=(V_{cp}+Vdd);\;N_2=V_{cp}$$

and moreover:

$$M_{bn3}\rightarrow ON;\;M_{bn4}\rightarrow OFF$$

$$V_{cp}=P_{gL}=(Vi(t)-Vdd)$$

In addition, in a second half-period of the clock signal, the following conditions arise:

$$FX=Vdd;\;FN=0\,V$$

$$M_{pL}\rightarrow ON;\;Ml_{pR}\rightarrow OFF$$

$$P_{gL}Vi(t);\;P_{gR}=(Vi(t)-Vdd)$$

In the same half-period of the clock signal, the following further conditions arise:

$$M_{bn1}\rightarrow ON;\;M_{bn2}\rightarrow OFF$$

$$N_1=V_{cp};\;N_2=(V_{cp}+Vdd)$$

and moreover:

$$M_{bn3}\rightarrow OFF;\;M_{bn4}\rightarrow ON$$

$$V_{cp}=P_{gR}=(Vi(t)-Vdd)$$

The biasing voltage $V_{cp}$, as desired, is hence constantly equal to the expression Vi(t)−Vdd, throughout the period of operation of the biasing circuit 10.

Basically, the circuit configuration of the biasing stage 16 is such as to exploit the same low voltage phase signals FX, FN as those sent to the control stage 12 for controlling opening and closing of the biasing transistors $M_{bn3}$, $M_{bn4}$ and consequent transfer to the output of the lower between the control signals $P_{gL}$, $P_{gR}$ received at input. Moreover, the further biasing transistors $M_{bn1}$, $M_{bn2}$ are for connecting, alternately, the buffer capacitors $C_b$ to the output of the biasing stage 16 to recover the charge lost in the previous half-period for driving the biasing transistors $M_{bn3}$, $M_{bn4}$.

The internal nodes 17, 18 hence may always be at voltage values such as to open/close in an effective and complete way, the transistors, the gate terminals of which are coupled to the same nodes. For example, a high voltage on the third internal node 17 enables, at the same time, closing of the biasing transistors $M_{bn3}$ and $M_{bn2}$, and hence both transfer of the first control signal $P_{gL}$ to the output and updating at the same output voltage of the buffer capacitor $C_b$ belonging to the fourth internal node 18. Instead, the biasing transistors $M_{bn4}$ and $M_{bn1}$ in the same half-period are open, given the complementarity of the low voltage phase signals FX, FN.

Figure 3:
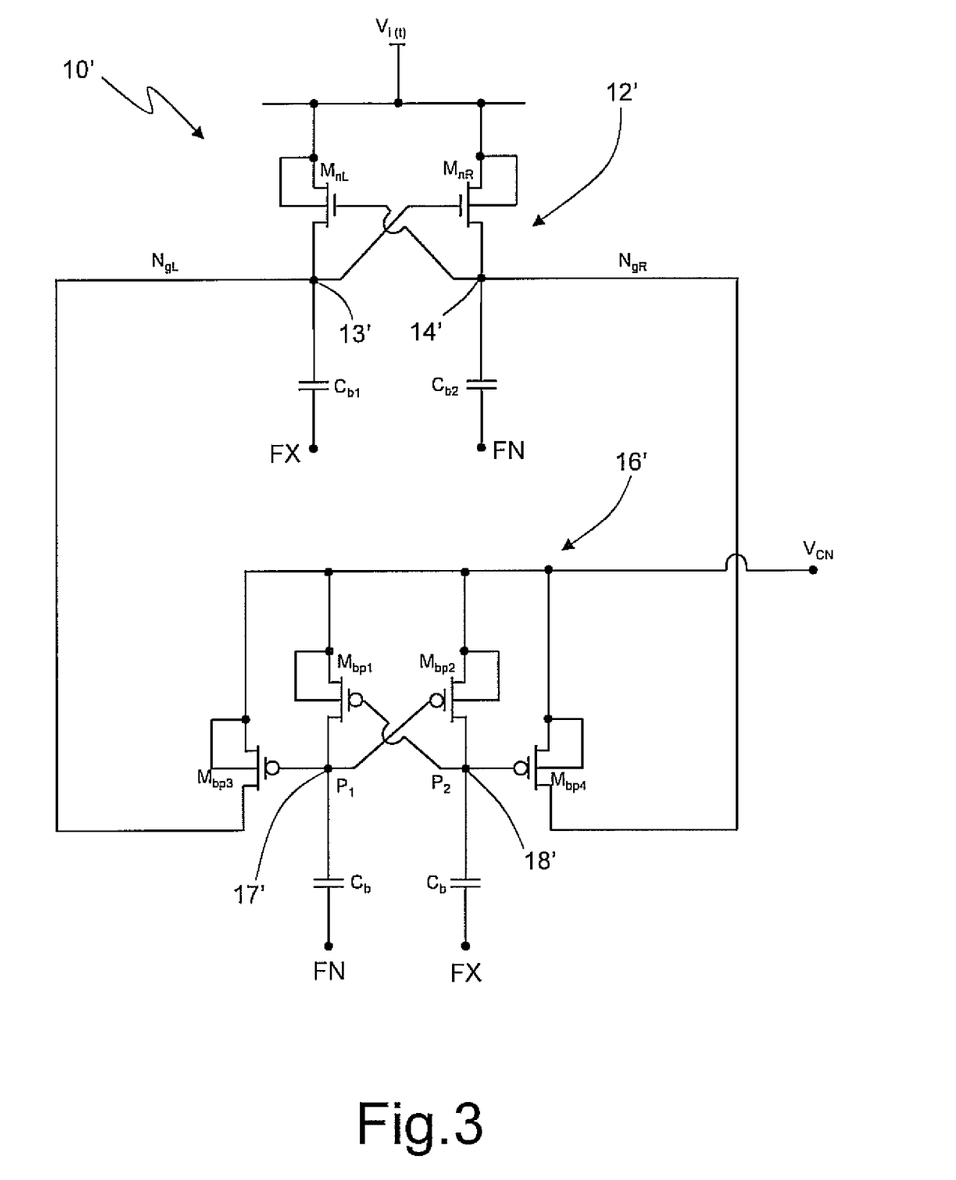
FIG. 3 is a schematic diagram of a biasing circuit according to a second embodiment of the present invention.

FIG. 3 illustrates a dynamic biasing circuit according to another embodiment of the present invention, designated as a whole by 10', in particular for biasing n-channel (transfer and/or protection) MOS transistors by generation of an appropriate biasing voltage $V_{cn}$.

It may be readily appreciated that the circuit structure is substantially similar to the one described with reference to FIG. 2, with the sole difference that the channel of the low voltage MOS transistors used in the circuit is dual (channel n instead of channel p, and vice versa). The control stage 12', hence comprises a first control transistor $M_{nL}$, and a second control transistor $M_{nR}$ of a low voltage NMOS type, and supplies, at an output, a first control signal $N_{gL}$ and a second control signal $N_{gR}$ that are to send corresponding n-channel transfer transistors (here not illustrated) into complete opening or closing. Likewise, the biasing stage 16', comprises biasing transistors $M_{bp1}$, $M_{bp2}$, $M_{bp3}$, and $M_{bp4}$ of a low voltage PMOS type. In particular, the first and second biasing transistors $M_{bp1}$, $M_{bp2}$ receive, on the respective gate terminals, gate signals $P_1$, $P_2$ to drive them appropriately in opening/closing, according to modalities similar to what has been discussed previously with reference to FIG. 2.

It may be hence verified that, in a first half-period of the clock signal, the following conditions arise:

$$FX=0\,V;\ FN=Vdd$$

$$M_{nL} \rightarrow ON;\ M_{nR} \rightarrow OFF$$

$$N_{gL}=Vi(t);\ N_{gR}=(Vi(t)+Vdd)$$

$$M_{bp1} \rightarrow ON;\ M_{bp2} \rightarrow OFF$$

$$P_1=V_{cn};\ P_2=(V_{cn}-Vdd)$$

$$M_{bp3} \rightarrow OFF;\ M_{bp4} \rightarrow ON$$

$$V_{cn}=N_{gR}=(Vi(t)+Vdd)$$

Moreover, in a second half-period of the clock signal, the following conditions arise:

$$FX=Vdd;\ FN=0\,V$$

$$M_{nL} \rightarrow OFF;\ M_{nR} \rightarrow ON$$

$$N_{gL}=(Vi(t)+Vdd);\ N_{gR}=Vi(t)$$

$$M_{bp1} \rightarrow OFF;\ M_{bp2} \rightarrow ON$$

$$P_1=(V_{cn}-Vdd);\ P_2=V_{cn}$$

$$M_{bp3} \rightarrow ON;\ M_{bp4} \rightarrow OFF$$

$$V_{cn}=N_{gL}=(Vi(t)+Vdd)$$

The biasing voltage $V_{cn}$, as desired, is hence typically constantly equal to the expression $Vi(t)+Vdd$, throughout the period of operation of the biasing circuit 10', in this way enabling an more effective and complete switching-on of n-channel protection transistors (here not illustrated).

Figure 4:
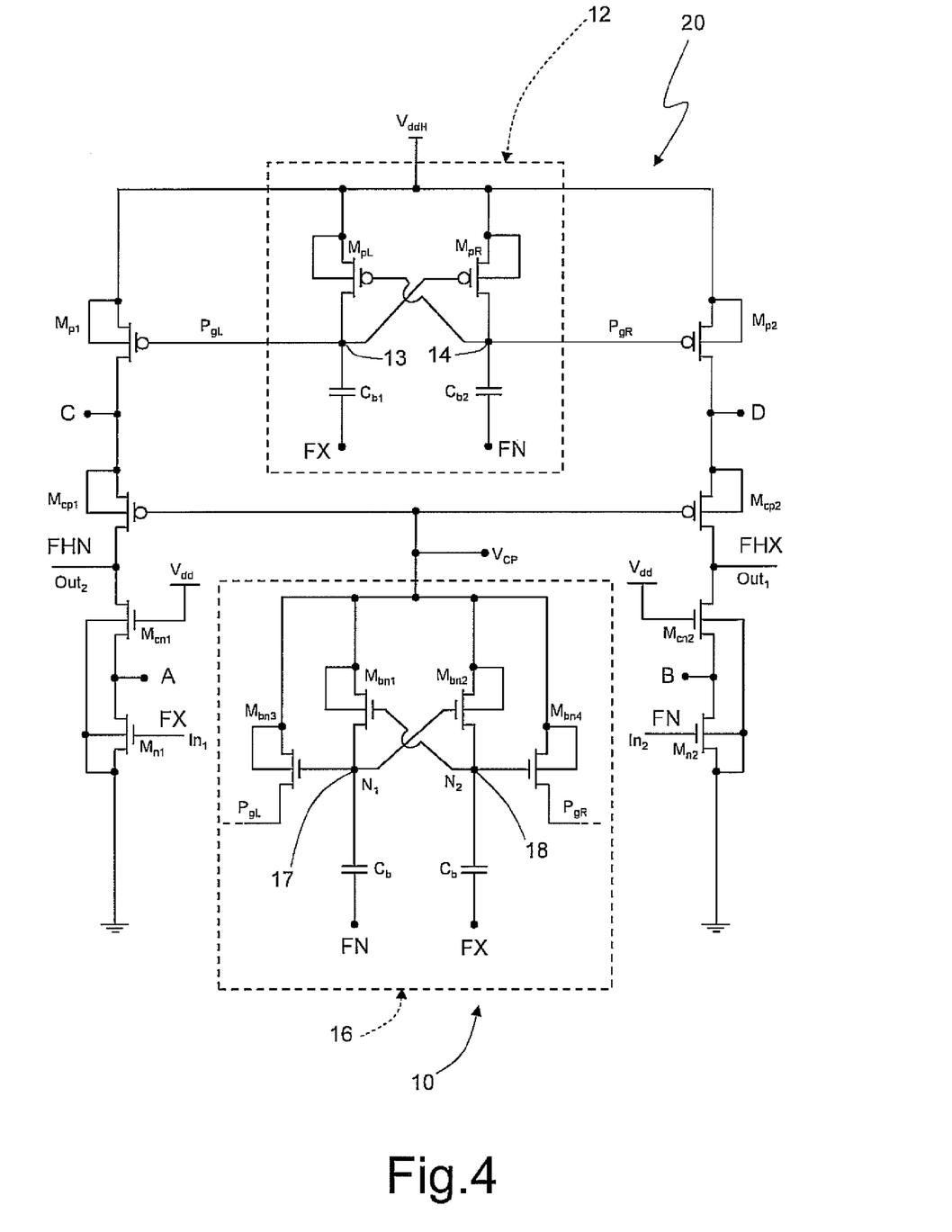
FIG. 4 is a schematic diagram of a level shifter circuit including the biasing circuit of FIG. 2.

There now follows a description, with reference to FIG. 4, of a possible use of the biasing circuit 10 in a level shifter circuit 20. In detail, the level shifter circuit 20 includes a first transfer transistor $M_{p1}$, of a low voltage PMOS type, which is connected between a first reference terminal (set at a high voltage Vi(t), here having a value VddH higher than the logic supply voltage Vdd) and an internal node C of the level shifter circuit 20, and has its gate terminal receiving the first control signal $P_{gL}$. The level shifter circuit 20 also includes a second transfer transistor $M_{p2}$, of a low voltage PMOS type, which is connected between the second reference terminal receiving the high voltage VddH and an internal node D, and has its gate terminal receiving the second control signal $P_{gR}$. The level shifter circuit 20 further includes a third transfer transistor $M_{n1}$, of a low voltage NMOS type, which is connected between a second reference terminal (set at ground potential Gnd) and an internal node A, and the gate terminal of which is connected to a first input terminal In1, receiving the first low voltage phase signal FX. A fourth transfer transistor $M_{n2}$, of a low voltage NMOS type, is connected between the first reference terminal set at ground potential and an internal node B, and the gate terminal of which is connected to a second input terminal In2 receiving the second low voltage phase signal FN.

The level shifter circuit 20 further includes appropriate protection elements, connected to a respective transfer transistor $M_{n1}$, $M_{n2}$, $M_{p1}$, $M_{p2}$, in "cascade" configuration (i.e., cascaded and traversed, in use, by the same current). These protection elements may prevent occurrence of overvoltages on the corresponding transfer transistors to reduce breakdown or damage thereto.

In detail, a first protection transistor $M_{cp1}$, of a low voltage PMOS type, is connected between the internal node C and a second output terminal Out2, present on which is, in use, a second high voltage phase signal FHN, and has a gate terminal that receives the biasing voltage $V_{cp}$, having an appropriate value. A second protection transistor $M_{cp2}$, of a low voltage PMOS type, is connected between the internal node D and a first output terminal Out1, present on which is, in use, a first high voltage phase signal FHX, and has a gate terminal that receives the same biasing voltage $V_{cp}$. A third protection transistor $M_{cn1}$, of a low voltage NMOS type, is connected between the internal node A and the second output terminal Out2, and has a gate terminal that receives the logic supply voltage Vdd. A fourth protection transistor $M_{cn2}$, of a low voltage NMOS type, is connected between the internal node B and the first output terminal Out1, and has a gate terminal that receives the logic supply voltage Vdd.

The level shifter circuit 20 further comprises the biasing circuit 10, described in detail with reference to FIG. 2, for generation of the control signals $P_{gL}$, $P_{gR}$ for the transfer transistors $M_{p1}$, $M_{p2}$ and for generation of the biasing voltage $V_{cp}$ for control and biasing of the protection transistors $M_{cp1}$, $M_{cp2}$. As it has been described in detail previously, the biasing voltage $V_{cp}$ has a constant value throughout the period of the clock signal, equal to the minimum of the values of the control signals $P_{gL}$, $P_{gR}$, i.e., equal in this case to VddH−Vdd.

During operation of the level shifter circuit 20, when the first low voltage phase signal FX is high (Vdd) and the second low voltage phase signal FN is low (Gnd), the first control signal $P_{gL}$ is brought to VddH, whereas the second control signal $P_{gR}$ is at (VddH−Vdd). In this condition, the third transfer transistor $M_{n1}$ is on, whereas the first transfer transistor $M_{p1}$ is off, in such a way that the second high voltage phase signal FHN is brought to Gnd (note that the third protection transistor $M_{cn1}$ is on, having its gate terminal at Vdd). In the same half-period of the clock signal, the fourth transfer transistor $M_{n2}$ is off, whereas the second transfer transistor $M_{p2}$ is on so that the first high voltage phase signal FHX is brought to VddH (note that the second protection transistor $M_{cp2}$ is on, based upon the appropriate value of the biasing voltage $V_{cp}$).

When, instead, the first low voltage phase signal FX is low (Gnd) and the second low voltage phase signal FN is high (Vdd), the first control signal $P_{gL}$ is brought to (VddH−Vdd) and the second control signal $P_{gR}$ is at VddH, thus obtaining that the second high voltage phase signal FHN goes to VddH and the first high voltage phase signal FHX goes to Gnd. There is thus obtained the desired operation of level shifting between the low voltage phase signals FX, FN and the corresponding high voltage phase signals FHX, FHN, which have corresponding values (high or low), but are shifted towards the high voltage level.

Some considerations are now made on the maximum voltage values within the level shifter circuit 20, in particular, to define the maximum value of the high voltage VddH at which the circuit can be used without any breakdown of the MOS transistors (by way of example, reference may be made, for these considerations, to the left branch of the level shifter circuit 20, referred to the second output terminal Out2, but altogether similar considerations apply to the right branch of the same circuit). When the first low voltage phase signal FX is at Gnd and the second high voltage phase signal FHN is at VddH, the third transfer transistor $M_{n1}$ is off, whereas the first transfer transistor $M_{p1}$ is on.

It may be readily appreciated that the only transistor that may present possible critical aspects, owing to the presence of possible overvoltages across its terminals, is the third protection transistor $M_{cn1}$. The drain terminal of this transistor is in fact at VddH, the gate terminal is at Vdd, whilst the source terminal is at (Vdd−Vth), where Vth is the threshold voltage of the transistor.

For the voltage on the gate oxide (i.e., the difference of potential between the drain and gate terminals) not to exceed Vdd (given the low voltage nature of the transistor), it may be sufficient to impose the following condition:

$VddH-Vdd \leq Vdd$ whence the condition to be satisfied by the value of the high voltage is obtained, as:

$VddH \leq 2 \cdot Vdd$

Likewise, in the case where the first high voltage phase signal FHN is at Gnd, it may readily be appreciated that it may be desirable that the voltage on the oxide of the first protection transistor $M_{cp1}$ does not exceed Vdd. This implies that $(V_{CP}-FHN) \leq Vdd$ whence $(VddH-Vdd) \leq Vdd$ and hence again the following condition must be satisfied:

$VddH \leq 2 \cdot Vdd$ i.e., the high voltage VddH generally must not exceed twice the value of the logic supply voltage Vdd.

For example, in the case where the minimum value of the logic supply voltage Vdd is equal to 1 V, it may be sufficient to impose that the high voltage VddH does not exceed the value of 2V to not incur in risks of breakdown of the oxides of the low voltage MOS transistors used in the level shifter circuit 20.

Figure 5:
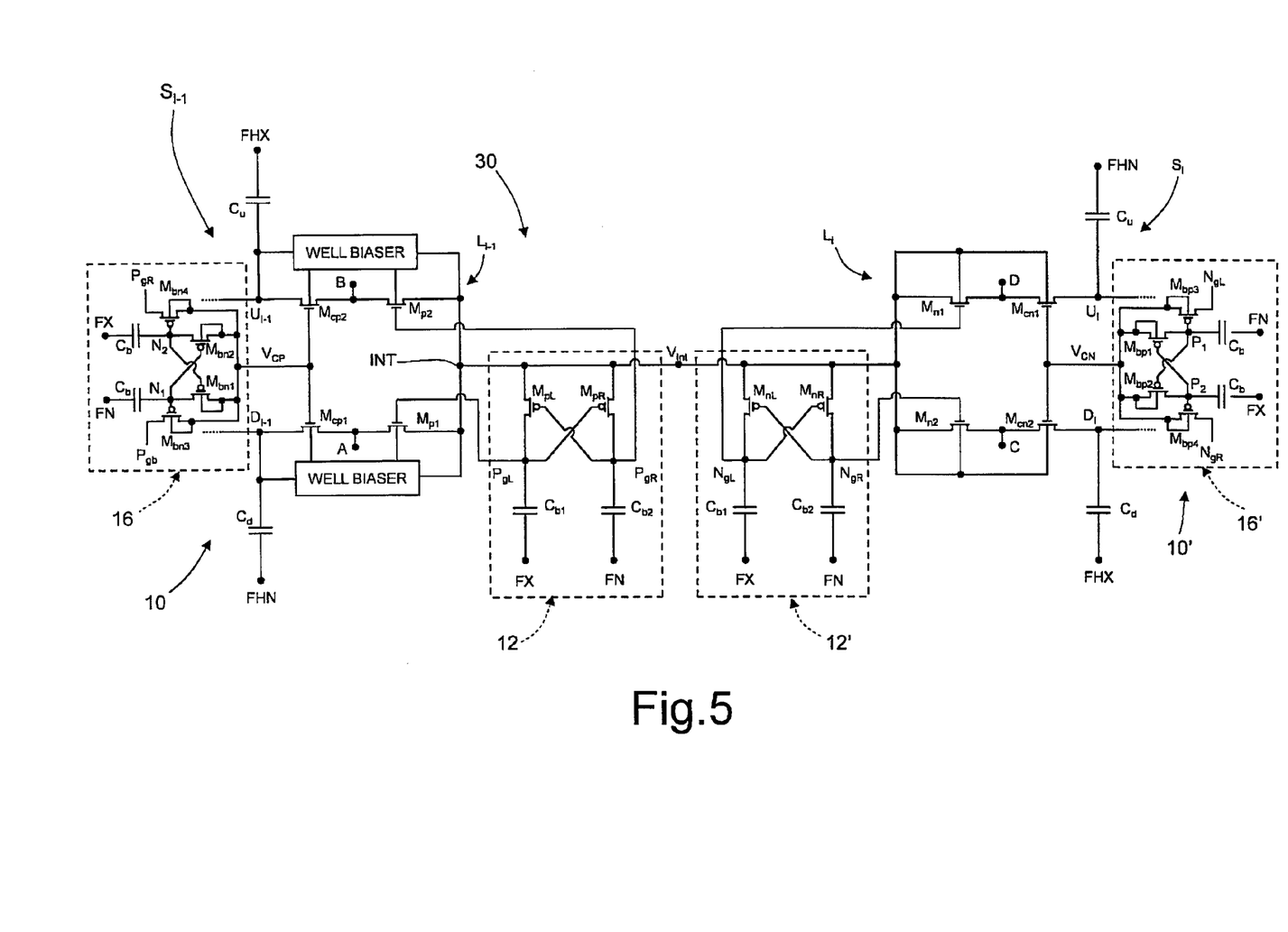
FIG. 5 is a schematic diagram of a charge-pump circuit including the biasing circuit of the biasing circuits of FIGS. 2 and 3.

There now follows a description, with reference to FIG. 5, of a further possible use of the biasing circuits 10, 10' in a charge-pump circuit 30, of the two-phase latch type. In particular, the charge-pump circuit 30 includes in this case both the biasing circuit 10 (described with reference to FIG. 2), for generation of control signals $P_{gL}$, $P_{gR}$ for p-channel transfer transistors and for generation of the biasing voltage $V_{cp}$ for control of protection transistors which are also of the p-channel type, and the biasing circuit 10' (described with reference to FIG. 3), for generation of control signals $N_{gL}$, $N_{gR}$ for n-channel transfer transistors and for generation of the biasing voltage $V_{cn}$ for control of protection transistors which are also of the n-channel type.

The charge-pump circuit 30 includes a plurality of charge-pump stages (of which only the i-1-th stage and the i-th stage are shown in the figure), each of which includes a first pump capacitor $C_u$, connected to a first internal node $U_i$ (considering the generic i-th stage), associated with a top branch of the circuit, and a second pump capacitor $C_d$, connected to a second internal node $D_i$, associated with a bottom branch of the circuit (the two, top and bottom, branches being involved in alternating half-periods by the transfer of charge between the pump capacitors of adjacent stages).

The charge-pump circuit 30 is supplied with a high supply voltage VddH, higher than the logic supply voltage Vdd. In particular, supplied to the pump capacitors $C_u$, $C_d$ (in an alternating way in the various successive stages) are high voltage phase signals FHX, FHN (operating in the high voltage range comprised between 0 V, or ground, and the high supply voltage VddH). The high voltage phase signals FHX, FHN have a high or low value corresponding to that of the low voltage phase signals FX, FN, being shifted with respect thereto towards high voltage values (the high voltage phase signals FHX, FHN are hence complementary to one another). Each charge-pump stage $S_i$ further includes a respective latch circuit $L_i$, provided with transfer transistors, appropriately controlled to enable transfer of charge from one stage to the next, and in particular, between the first pump capacitors $C_u$ of the top branch, in a first operating half-period (referred to the clock signal), and between the second pump capacitors $C_d$ of the bottom branch, in the second operating half-period of the clock signal.

By way of example, FIG. 5 shows only the transfer transistors that enable transfer of charge from the charge-pump stage $S_{i-1}$ to the subsequent charge-pump stage $S_i$, and in particular a first transfer transistor $M_{p1}$, of a low voltage PMOS type (here shown only in the charge-pump stage $S_{i-1}$), which is connected between an intermediate node INT (set between the consecutive charge-pump stages $S_{i-1}$ and $S_i$) and the internal node $D_{i-1}$, by interposition of a first protection transistor $M_{cp1}$, and has its gate terminal receiving the control signal $P_{gL}$ (in turn, the first protection transistor $M_{cp1}$ receives on its gate terminal the biasing voltage $V_{cp}$). A second transfer transistor $M_{p2}$, of a low voltage PMOS type, is connected between the intermediate node INT and the internal node $U_{i-1}$, by interposition of a second protection transistor $M_{cp2}$, and has its gate terminal receiving the control signal $P_{gR}$ (in turn, the second protection transistor $M_{cp2}$ receives on its gate terminal the biasing voltage $V_{cp}$). A third transfer transistor $M_{n1}$, of a low voltage NMOS type (here shown only in the charge-pump stage $S_i$), is connected between the intermediate node INT and the internal node $U_i$, by interposition of a third protection transistor $M_{cn1}$, and has its gate terminal receiving the control signal $N_{gL}$ (in turn, the third protection transistor $M_{cn1}$ receives on its gate terminal the biasing voltage $V_{cn}$). A fourth transfer transistor $M_{n2}$, of a low voltage NMOS type, is connected between the intermediate node INT and the internal node $D_i$, by interposition of a fourth protection transistor $M_{cn2}$, and has its gate terminal receiving the control signal $N_{gR}$ (in turn, the fourth protection transistor M receives on its gate terminal the biasing voltage $V_{cn}$).

The voltage $V_{int}$ on the intermediate node INT, which remains substantially constant throughout the operating period, is used by the biasing circuits 10, 10' for correctly controlling switching-on and switching-off of the transfer transistors in the latch circuits $L_{i-1}$, $L_i$ (this voltage $V_{int}$ here represents the high voltage Vi(t), which must be transferred from one stage to the next). In particular, the biasing voltage $V_{cp}$ has a constant value (throughout the period of the clock signal), equal to the minimum voltage that can be assumed by the control signals $P_{gL}$, $P_{gR}$, which is in particular equal to ($V_{int}$−Vdd), whereas the biasing voltage $V_{cn}$ has a constant value equal to the maximum voltage that can be assumed by the control signals $N_{gL}$, $N_{gR}$, which is in particular equal to ($V_{int}$+Vdd).

In detail, in a first half-period of the clock signal, the following conditions arise, which give rise to a transfer (or sharing) of charge between the pump capacitors $C_u$ coupled to the top nodes of the circuit $U_{i-1}$ and $U_i$:

FN=Gnd, FX=Vdd, FHN=Gnd, FHX=VddH:

$V(U_{i-1})$ (note that V(U) and V(D) are the voltages at the corresponding nodes U and D) goes to a high value, and $V(D_{i-1})$ goes to a low value. Likewise $V(U_i)$ is at a low value, whereas $V(D_i)$ is at a high value. The control signal $P_{gL}$ goes to a high value (equal to $V_{int}$), whereas the control signal $P_{gR}$ goes to a low value (in particular, it decreases by a value equal to the logic supply voltage Vdd with respect to $V_{int}$), thus enabling switching-on of the first transfer transistor $M_{p1}$ and switching-off of the second transfer transistor $M_{p2}$. In the same half-period, the control signal $N_{gL}$ goes to a high value (higher by a value equal to the supply voltage Vdd with respect to $V_{int}$), and the third control node $N_{gR}$ goes to a low value. Consequently, the third transfer transistor $M_{n1}$ is on, and the fourth transfer transistor $M_{n2}$ is off. In this way, charge sharing is obtained between the two pump capacitors $C_u$, adjacent to one another, connected to the nodes $U_{i-1}$, $U_i$, whereas charge sharing is prevented between the two pump capacitors $C_d$, connected to the nodes $D_{i-1}$, $D_i$ (note that by "sharing" is here meant a transfer of charge from the previous stage to the next stage). Likewise, it may be possible to verify that in a second half-period of the clock signal (where FN=Vdd, FX=0 V, FHN=VddH, FHX=0 V), a transfer (or sharing) of charge takes place between the pump capacitors $C_d$ coupled to the bottom nodes of the circuit $D_{i-1}$ and $D_i$.

Advantageously, during the two half-periods in which the control signals $P_{gL}$, $P_{gR}$, $N_{gL}$, $N_{gR}$ switch to a high or low value, they remain throughout charge sharing at a substantially constant voltage, of a value such as to enable an effective switching-on, or switching-off, of the transfer transistors connected thereto (in other words, any fluctuations of the logic supply voltage Vdd may be prevented from possibly jeopardising switching-on/switching-off of the same transistors).

In addition, the appropriate values of the biasing voltage $V_{cn}$, as well as of the biasing voltage $V_{cp}$, enable the protection transistors to be driven into complete switching-on/switching-off, thus preventing overvoltages on the corresponding transfer transistors. It should be noted, in particular, that these voltage values are generated starting from the voltage $Vi_{int}$ on the intermediate node INT, hence adapting in a dynamic way to the value assumed by the same voltage (which, in particular, varies from one stage to another of the charge-pump circuit 30).

The advantages of the biasing circuit according to the present embodiments may be clear from the foregoing description. In any case, it is once again emphasized that the circuit described enables appropriate dynamic biasing of the protection stages (including protection transistors connected in cascode configuration to corresponding transfer transistors), in particular even in the cases where it may be desired to use dynamic voltage levels (i.e., ones variable with time or with the operating conditions), starting from a pre-existing voltage level. In particular, this pre-existing voltage level can also vary with time, provided that its variation is sufficiently slow with respect to the frequency of the clock signal used in the biasing circuit.

Advantageously, for example, correct biasing of the protection transistors of each stage of a charge-pump circuit is obtained, or else a correct biasing voltage level for the protection transistors of a level shifter circuit. The dynamic biasing circuit proposed moreover has a reduced current consumption. In fact, the circuit does not use static biasing paths that absorb current from the nodes at higher voltage (for example, from the intermediate nodes of a charge-pump circuit), hence presenting a reduced static consumption, basically consuming current only for charging the parasitic capacitances (having a small value in the circuit described). Considering, for example, that in general, in a charge-pump circuit a static consumption is multiplied by the factor of inefficiency of the pump (for example, if I is the static consumption and N the number of the stages of the charge-pump circuit, the total consumption required of the power supply is equal to (N+1)·I). The saving of current afforded by the solution described is evident.

Finally, modifications and variations may be made to what is described and illustrated herein, without thereby departing from the scope of the present invention, as defined in the annexed claims. In particular, the biasing circuit finds advantageous, though not exclusive, application within a charge-pump circuit or a level shifter circuit, as described previously in detail. Other uses can, however, be envisaged, in all those cases where it may be desirable to bias in an appropriate way protection stages of an electronic integrated circuit.

That which is claimed:

1. A biasing circuit comprising:
  an input configured to receive a supply voltage;
  an output;
  a control stage configured to generate first and second control signals, said control stage comprising
    a first biasing capacitor coupled to a first internal node and configured to receive a first low voltage phase signal,
    a second biasing capacitor coupled to a second internal node and configured to receive a second low voltage phase signal,
    a first control transistor coupled between the input and the first internal node, and having a control terminal coupled to the second internal node, and
    a second control transistor coupled between the input and the second internal node, and having a control terminal coupled to the first internal node; and
  a biasing stage configured to generate on the output a biasing voltage based upon the first and second control signals, said biasing stage comprising
    a first buffer capacitor coupled connected to a third internal node and configured to receive the second low voltage phase signal, and a second buffer capacitor coupled to a fourth internal node and configured to receive the first low voltage phase signal,
    a first biasing transistor coupled between the third internal node and the output, and having a respective control terminal coupled to the fourth internal node,
    a second biasing transistor coupled between the fourth internal node and the output, and having a respective control terminal coupled to the third internal node,
    a third biasing transistor having a first conduction terminal configured to receive the first control signal, and a second conduction terminal coupled to the output, and having a respective control terminal coupled to the third internal node, and
    a fourth biasing transistor having a first conduction terminal configured to receive the second control signal, and a second conduction terminal coupled to the output, and having a respective control terminal coupled to the fourth internal node.

2. The biasing circuit according to claim 1, wherein said control stage is configured to adjust a value of the first and second control signals by a value equal to a limit voltage less than the supply voltage.

3. The biasing circuit according to claim 1, wherein said biasing stage is configured to generate the biasing voltage equal to at least one of a minimum and a maximum of values of the first and second control signals.

4. The biasing circuit according to claim 1, wherein said first control transistor and said second control transistor are configured to sustain voltages between at least one of corresponding current-conduction terminals and control terminals not higher than a limit voltage less than the supply voltage.

5. The biasing circuit according to claim 1, wherein said first, second, third, and fourth biasing transistors are configured to sustain voltages across at least one of the corresponding current-conduction terminals and control terminals not higher than a limit voltage less than the supply voltage.

6. The biasing circuit according to claim 1, wherein the first and second control signals have alternating values that are a function of the supply voltage and a limit voltage, the supply voltage being less than or equal to twice the limit voltage.

7. An electronic integrated circuit comprising:
a first transfer transistor coupled between a first transfer terminal configured to receive a high voltage, having a value higher than a limit voltage, and a second transfer terminal, said first transistor configured to selectively enable communication between the first and second transfer terminals;
a second transfer transistor, coupled between the first transfer terminal and a respective second transfer terminal, said second transfer transistor configured to selectively enable communication between the first transfer terminal and the respective second transfer terminal;
a first protection transistor;
a second protection transistor coupled to said first protection transistor, said first and second protection transistors coupled between said first and second transfer transistors and the respective second transfer terminal; and
a first biasing circuit comprising
an input configured to receive a supply voltage, a value of which is higher than the limit voltage;
an output;
a control stage configured to generate a first control signal and a second control signal, with mutually complementary values, equal alternately to a first value in a first half-period of a clock signal, and to a second value in a second half-period of the clock signal, the first and second values being a function of the supply voltage and of the limit voltage; and
a biasing stage configured to generate on the output a biasing voltage as a function of the values of the first control signal and of the second control signal;
said first biasing circuit configured to receive the high voltage as a supply voltage, and to send the first control signal and the second control signal to a control terminal of the first transfer transistor and of the second transfer transistor, respectively, and to send the biasing voltage to a respective control terminal of said first protection transistor and of said second protection transistor.

8. The electronic integrated circuit according to claim 7, wherein said first and second protection transistors are coupled in a cascode configuration to said first and second transfer transistors, respectively.

9. The electronic integrated circuit according to claim 7, wherein said first and second transfer transistors, and said first and second protection transistors comprise p-channel MOS transistors; and wherein said first biasing circuit is configured to generate the biasing voltage equal to a minimum of the values of the first control signal and of the second control signal, and to have a substantially constant value throughout the period of the clock signal.

10. The electronic integrated circuit according to claim 7, further comprising:
a first input configured to receive a first low voltage phase signal, having a first voltage dynamic with a first maximum value equal to the limit voltage;
a second input configured to receive a second low voltage phase signal, complementary with respect to the first low voltage phase signal and having the first voltage dynamic; and
a third transfer transistor; and
a fourth transfer transistor coupled between a second reference terminal and the respective second transfer terminal associated with said first and second transfer transistors, respectively,
a third protection transistor;
a fourth protection transistor;
said fourth transistor being coupled between the second reference terminal and the respective second transfer terminal via said third and said fourth protection transistors, respectively;
said third transfer transistor ($M_{n1}$) having a control terminal configured to receive the first low voltage phase signal;
said fourth transfer transistor having a control terminal configured to receive the second low voltage phase signal;
the respective second transfer terminal being configured to supply a first high voltage phase signal, level-shifted with respect to the first low voltage signal and having a second voltage dynamic with a second maximum value, higher than the first maximum value and equal to the high voltage, and, respectively, a second high voltage phase signal, level-shifted with respect to the second low voltage signal and having the second voltage dynamic.

11. The electronic integrated circuit according to claim 7, further comprising:
a plurality of charge-pump stages coupled to one another in a cascaded configuration, each charge-pump stage comprising
a first pump capacitor coupled to the respective second transfer terminal associated with said second transfer transistor, and configured to receive a first high voltage phase signal, level-shifted with respect to the first low voltage signal and having a second voltage dynamic with a second maximum value, higher than the first maximum value and equal to the high voltage,
a second pump capacitor coupled to the respective second transfer terminal associated with said first transfer transistor, and configured to receive a second high voltage phase signal, complementary with respect to the first high voltage phase signal, and having the second voltage dynamic;
a third protection transistor,
a fourth protection transistor,
a third transfer transistor coupled to the respective second transfer terminal associated with said second transfer transistor via said third protection transistor, and
a fourth transfer transistor coupled to the respective second transfer terminal associated with said first transfer transistor via said fourth protection transistor; and a second biasing circuit configured to send a respective first control signal and a respective second control signal to a control terminal of said third transfer transistor and of said fourth transfer transistor, respectively, and to send a respective biasing voltage to a control terminal of said third protection transistor and of said fourth protection transistor.

12. The electronic integrated circuit according to claim 11, wherein said second biasing circuit comprises:
   an input configured to receive a supply voltage, a value of which is higher than a limit voltage;
   an output;
   a control stage configured to generate a first control signal and a second control signal, with mutually complementary values, equal alternately to a first value in a first half-period of a clock signal, and to a second value in a second half-period of the clock signal, the first and second values being a function of the supply voltage and of the limit voltage; and
   a biasing stage configured to generate on the output a biasing voltage as a function of the values of the first control signal and of the second control signal.

13. A method of making a biasing circuit comprising:
   configuring a control stage to generate first and second control signals, configuring the control stage comprising
      coupling a first biasing capacitor to a first internal node and to receive a first low voltage phase signal,
      coupling a second biasing capacitor to a second internal node and to receive a second low voltage phase signal,
      coupling a first control transistor between an input receiving a supply voltage and the first internal node so that a control terminal thereof is coupled to the second internal node, and
      coupling a second control transistor between the input and the second internal node so that a control terminal thereof is coupled to the first internal node; and
   configuring a biasing stage to generate, on an output, a biasing voltage based upon the first and second control signals, configuring the biasing state comprising
      coupling a first buffer capacitor to a third internal node and to receive the second low voltage phase signal,
      coupling a second buffer capacitor to a fourth internal node and to receive the first low voltage phase signal,
      coupling a first biasing transistor between the third internal node and the output so that a respective control terminal is coupled to the fourth internal node,
      coupling a second biasing transistor between the fourth internal node and the output so that a respective control terminal is coupled to the third internal node,
      coupling a third biasing transistor so that a first conduction terminal receives the first control signal, a second conduction terminal is coupled to the output, and a respective control terminal is coupled to the third internal node, and
      coupling a fourth biasing transistor so that a first conduction terminal receives the second control signal, a second conduction terminal is coupled to the output, and a respective control terminal is coupled to the fourth internal node.

14. The method according to claim 13, wherein the control stage adjusts a value of the first and second control signals by a value equal to a limit voltage less than the supply voltage.

15. The method according to claim 13, wherein the biasing stage generates the biasing voltage to be equal to at least one of a minimum and a maximum of values of the first and second control signals.

16. The method according to claim 13, wherein the first control transistor and the second control transistor sustain voltages between at least one of corresponding current-conduction terminals and control terminals not higher than a limit voltage less than the supply voltage.

17. The method according to claim 13, wherein the first, second, third, and fourth biasing transistors sustain voltages across at least one of the corresponding current-conduction terminals and control terminals not higher than a limit voltage less than the supply voltage.

18. The method according to claim 13, wherein the first and second control signals have alternating values that are a function of the supply voltage and a limit voltage, the supply voltage being less than or equal to twice the limit voltage.

* * * * *